United States Patent
Britz

(10) Patent No.: US 9,607,913 B1
(45) Date of Patent: Mar. 28, 2017

(54) LOW POWER, TEMPERATURE REGULATED CIRCUIT FOR PRECISION INTEGRATED CIRCUITS

(71) Applicant: Fluke Corporation, Everett, WA (US)

(72) Inventor: William J. Britz, Tulalip, WA (US)

(73) Assignee: FLUKE CORPORATION, Everett, WA (US)

( * ) Notice: Subject to any disclaimer, the term of this patent is extended or adjusted under 35 U.S.C. 154(b) by 0 days.

(21) Appl. No.: 15/099,341

(22) Filed: Apr. 14, 2016

(51) Int. Cl.
| | |
|---|---|
| H01L 23/58 | (2006.01) |
| H01L 21/66 | (2006.01) |
| H01L 23/053 | (2006.01) |
| H01L 23/08 | (2006.01) |
| H01L 23/32 | (2006.01) |
| H01L 23/34 | (2006.01) |
| H01L 23/498 | (2006.01) |
| H01L 21/48 | (2006.01) |
| H01L 21/52 | (2006.01) |

(52) U.S. Cl.
CPC .......... *H01L 22/34* (2013.01); *H01L 21/4853* (2013.01); *H01L 21/52* (2013.01); *H01L 22/20* (2013.01); *H01L 23/053* (2013.01); *H01L 23/08* (2013.01); *H01L 23/32* (2013.01); *H01L 23/345* (2013.01); *H01L 23/49811* (2013.01); *H01L 23/49827* (2013.01)

(58) Field of Classification Search
CPC ......... H01L 21/52; H01L 22/20; H01L 22/34; H01L 23/08; H01L 23/053; H01L 23/345; H01L 41/0825; H01L 2924/13072; H01L 29/72; H01L 2924/20111
USPC ........................... 257/48; 438/48, 50, 53, 56
See application file for complete search history.

(56) References Cited

U.S. PATENT DOCUMENTS

| | | | |
|---|---|---|---|
| 2008/0178674 A1* | 7/2008 | Walmsley | ............. G01P 15/125 73/514.01 |
| 2010/0180681 A1* | 7/2010 | Dwyer | ................ G01P 15/0802 73/514.17 |

* cited by examiner

*Primary Examiner* — Brook Kebede
(74) *Attorney, Agent, or Firm* — Seed IP Law Group LLP

(57) ABSTRACT

Various embodiments provide a temperature regulated circuit. The temperature regulated circuit includes a suspended mass that is positioned in an opening of a frame. The suspended mass is suspended from the frame by a plurality of support beams that may be made of thermally insulating material. The suspended mass provides a thermally isolated substrate for an integrated circuit. The suspended mass also includes a temperature sensor configured to measure a temperature of the integrated circuit, and a heater configured to heat the integrated circuit. A controller is positioned on the frame and is configured to receive temperature measurements from the temperature sensor and control the heater based on the temperature measurements.

20 Claims, 5 Drawing Sheets

LOW POWER, TEMPERATURE REGULATED CIRCUIT FOR PRECISION INTEGRATED CIRCUITS

BACKGROUND

Technical Field

The present disclosure is directed to a temperature regulated circuit and methods of fabricating the same.

Description of the Related Art

Many precision integrated circuits require a stabilized temperature to function properly. A common solution for temperature regulation is to couple the precision integrated circuit to a heater to compensate for heat loss. Namely, a heater may be used to provide heat and compensate for any heat that is dissipated from the precision integrated circuit to adjacent structures.

Current methods for heating integrated circuits include the use of hybrid thick film heaters with alumina substrates and discrete heater resistors on epoxy-glass PCB material. A well-known solution for temperature regulation is the LM399 voltage reference. Such methods, however, typically consume large amounts of power. For example, hybrid thick film heaters with alumina substrates and discrete heater resistors on epoxy-glass PCB material each typically consume 100 milliwatts to a few watts of power.

Accordingly, integrated circuits that require such heaters are generally limited in application to large, lab grade products, and are not suitable for portable devices with limited power sources. Thus, it is desirable to have a low power solution for temperature regulation of precision integrated circuits.

BRIEF SUMMARY

The present disclosure provides a temperature regulated circuit for precision integrated circuits. The temperature regulated circuit provides a temperature controlled environment that is independent of external environmental conditions.

According to at least one embodiment, the temperature regulated circuit includes a frame, a suspended mass, support beams, an integrated circuit, a temperature sensor, a heater, a controller, bond pads, and conductive tracks.

The suspended mass is positioned in an opening of the frame and is suspended from the frame by the support beams. The suspended mass includes the integrated circuit, the temperature sensor, and the heater. The integrated circuit may be any integrated circuit that would benefit from having a stabilized temperature. The temperature sensor generates a temperature signal that is proportional to a temperature of the integrated circuit. The temperature signal may be used by the controller, or an error integrator that controls a voltage to the heater, to continuously adjust the temperature of the suspended mass until the temperature signal from the temperature sensor is equal to a predetermined threshold. The controller is positioned on the frame. The bond pads are positioned on the frame and provide a conductive pad for receiving wire bonds and connecting the bond pads to an external location. The conductive tracks are formed on the support beams. The conductive tracks provide electrical connections between the integrated circuit, the temperature sensor, and the heater that are on the suspended mass and the controller and the bond pads that are on the frame.

The suspended mass provides a thermally isolated substrate. By fabricating the integrated circuit on the suspended mass, the integrated circuit is thermally insulated and heat dissipation from the integrated circuit is minimized. The thermal resistance of the suspended mass is inversely proportional to the power required to heat it. By minimizing the size of the heated substrate, and therefore maximizing its thermal resistance, the power required is minimized. Further, the heater is fabricated on the suspended mass, adjacent to the integrated circuit. As a result, the integrated circuit may be heated rapidly and the heater may conserve power. In addition, the controller is fabricated on the frame instead of the suspended mass. By fabricating the controller on the frame, the size of the suspended mass may be reduced.

According to another embodiment, the temperature regulated circuit includes wafer-level packaging to increase the thermal resistance of the integrated circuit and further reduce the power needed to regulate the temperature.

According to another embodiment, the temperature regulated circuit is in a hermetic vacuum package to increase the thermal resistance of the integrated circuit and further reduce the power needed to regulate the temperature.

The temperature regulated circuit disclosed herein results in a low power solution for temperature regulation. Reducing the power needed to regulate the temperature of the integrated circuit increases the potential applications for integrated circuit. For instance, the integrated circuit may be used in hand-held instruments that have a limited power source.

DETAILED DESCRIPTION

Figure 1:
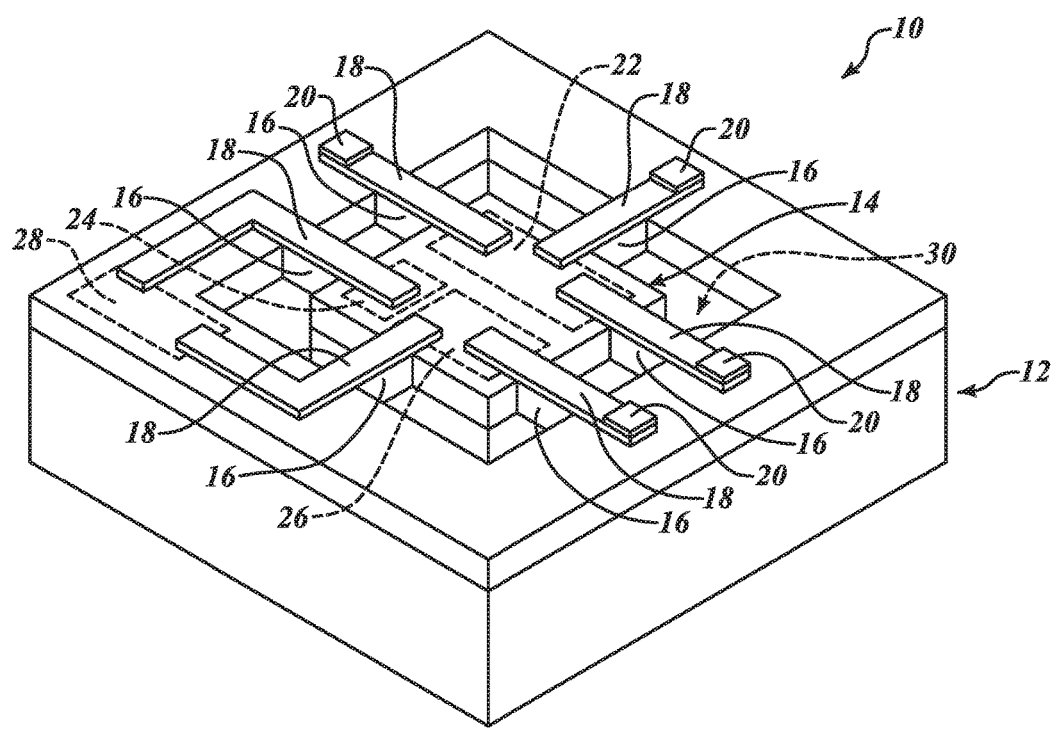
FIG. 1 is a simplified perspective view of a temperature regulated circuit according to at least one embodiment disclosed herein.

In the following description, certain specific details are set forth in order to provide a thorough understanding of various embodiments of the disclosure. However, one skilled in the art will understand that the disclosure may be practiced without these specific details. In some instances, well-known details associated with semiconductors and integrated circuits have not been described to avoid obscuring the descriptions of the embodiments of the present disclosure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale.

FIG. 1 is a simplified perspective view of a temperature regulated circuit 10 according to principles disclosed herein. The temperature regulated circuit 10 includes a frame 12, a suspended mass 14, support beams 16, conductive tracks 18, bond pads 20, an integrated circuit 22, a temperature sensor 24, a heater 26, and a controller 28.

The frame 12 provides a support structure for suspending the suspended mass 14. In a preferred embodiment, as shown in FIG. 1, the frame 12 is rectangular; however, the frame 12 may have any shape. The frame 12 includes an opening 30 and the controller 28. The controller 28 will be discussed in further detail below.

The suspended mass 14 provides a thermally isolated substrate. The suspended mass 14 is positioned in the opening 30 of the frame 12 and is suspended from the frame 12. In a preferred embodiment, as shown in FIG. 1, the suspended mass 14 has the same rectangular shape as the frame 12; however, the suspended mass 14 may have any shape. In a preferred embodiment, the suspended mass 14 has a thickness that is smaller than the thickness of the frame 12 to prevent the suspended mass 14 from contacting a surface below the suspended mass 14, e.g., as shown in FIG. 3B. The suspended mass 14 includes the integrated circuit 22, the temperature sensor 24, and the heater 26. The integrated circuit 22, the temperature sensor 24, and the heater 26 will be discussed in further detail below.

The support beams 16 couple the suspended mass 14 to the frame 12. In a preferred embodiment, the support beams 16 space the suspended mass 14 from the frame 12 on each side of the suspended mass 14 to increase the thermal isolation of the suspended mass 14. In a preferred embodiment, each of the support beams 16 have a width substantially smaller than a width of the suspended mass 14. Further, in a preferred embodiment, the support beams 16 are made of a thermally insulating material, such as silicon dioxide, to minimize heat dissipation through the support beams 16. It should be noted that, although six support beams 16 are shown in FIG. 1, the temperature regulated circuit 10 may include any number of support beams. For example, in one embodiment, the temperature regulated circuit 10 includes four support beams with one support beam on each side of the suspended mass 14. In another embodiment, the temperature regulated circuit 10 includes more than six support beams to accommodate additional conductive tracks.

The conductive tracks 18 provide electrical connections between circuitry on the suspended mass 14 and circuitry or bond pads on the frame 12. Particularly, as shown in FIG. 1, the conductive tracks 18 couple the integrated circuit 22 and the heater 26 to bond pads 20, and couple the temperature sensor and the heater 26 to the controller 28. In a preferred embodiment, each of the conductive tracks 18 is formed on a respective support beam such that there is an equal number of conductive tracks 18 and support beams 16. In another embodiment, a plurality of conductive tracks is formed on a single support beam such that the number of conductive tracks 18 is greater than the number of support beams 16. In a preferred embodiment, the conductive tracks 18 substantially cover the upper surfaces of the support beams 16. For example, as shown in FIG. 1, each of the conductive tracks 18 approximately covers the entire upper surface of the respective support beam 16. As a result, the support beams 16 are strengthened and are able support greater loads on the suspended mass 14.

The bond pads 20 provide a conductive pad for receiving wire bonds and connecting the bond pads 20 to an external location. The bond pads 20 are formed on the frame 12. Namely, each of the bond pads 20 is formed on a portion of a conductive track that is on the frame 12.

The integrated circuit 22 may be any integrated circuit that would benefit from having a stabilized temperature. For example, the integrated circuit 22 may be a reference amplifier, a differential NPN pair, a resistor network that include NiCr or SiCr thin film resistors, or an operational amplifier.

The temperature sensor 24 is configured to measure the temperature of the integrated circuit 22 and generate a temperature signal that is proportional to the temperature of the integrated circuit 22. The temperature sensor 24 is electrically coupled to the controller 28 through one of the conductive tracks 18. Although not shown in FIG. 1, the temperature sensor 24 may also be electrically coupled to a bond pad that is on the frame 12. As will be discussed in further detail below, the temperature sensor 24 provides temperature measurements to the controller 28. In a preferred embodiment the temperature sensor 24 is positioned in close proximity to the integrated circuit 22 to ensure that accurate temperature measurements of the integrated circuit 22 are obtained.

The heater 26 is configured to heat the integrated circuit 22. The heater 26 is electrically coupled to the controller 28 and to one of the bond pads 20 through respective conductive tracks 18. As will be discussed in further detail below, the heater 26 is controlled by the controller 28. In a preferred embodiment, the heater 26 is positioned in close proximity to the integrated circuit 22. As will be discussed in further detail below, positioning the heater 26 closer to the integrated circuit allows the integrated circuit to be heated faster and helps to reduce power consumption.

The controller 28 is positioned on the frame 12. The controller 12 is configured to receive temperature measurements from the temperature sensor 24 and control the heater 26 based on the temperature signals received from the temperature sensor 24. In one embodiment, the controller 28 receives a temperature signal from the temperature sensor 24, determines whether the temperature signal is below a predetermined threshold, and sends a command to the heater 26 to heat the integrated circuit 22 when the temperature signal is below the predetermined threshold. In the same or another embodiment, the controller 28 receives a temperature signal from the temperature sensor 24, determines whether the temperature signal exceeds a predetermined threshold, and sends a command to the heater 26 to stop heating the integrated circuit 22 when the temperature signal exceeds the predetermined threshold. In the same or another embodiment, the controller 28, or an error integrator that controls a voltage to the heater 26, continuously receives temperature signals from the temperature sensor 24, and continuously adjusts the heater 26 until a current temperature signal is equal to a predetermined threshold.

By positioning the controller 28 on the frame 12, instead of the suspended mass 14, the size of the suspended mass 14 may be reduced. Namely, the suspended mass 14 may be large enough to accommodate only the integrated circuit 22, the temperature sensor 24, and the heater 26. As will be discussed in further detail below, the minimal size of the suspended mass 14 allows the integrated circuit 22 to be heated faster and helps to reduce power consumption.

The temperature regulated circuit 10 provides a low power solution to regulate temperature of the integrated circuit 22. By fabricating the integrated circuit 22 on the suspended mass 14, the integrated circuit 22 is thermally isolated from neighboring surfaces. Further, any heat dissipation through the support beams 16 is minimal as the support beams 16, in a preferred embodiment, is made of a thermally insulating material. By minimizing heat dissipation, the integrated circuit 22 is able to maintain its temperature for longer periods of time. Thus, the heater 26 may be used moderately. As a result, the power needed to regulate the temperature of the integrated is greatly reduced. For example, assuming the temperature regulated circuit 10 has a thermal isolation to ambient of approximately 8000 degrees Celsius per watt, the heater 26 would consume under 5 milliwatts for a regulated temperature of 60 degrees Celsius and an ambient temperature of 25 degrees Celsius.

Further, positioning the heater 26 on the suspended mass 14 in close proximity to the integrated circuit 22 allows the integrated circuit 22 to be heated faster. As a result, the heater 26 may be powered on for shorter periods of time and power may be conserved. In addition, positioning the controller 28 on the frame, instead of the suspended mass, allows the size of the suspended mass 14 to be scaled down. Accordingly, the suspended mass 14 may be heated faster as a smaller mass is heated faster than a larger mass. Thus, the heater 26 may be powered on for shorter periods of time and power may be conserved.

Reducing the needed power to a few milliwatts increases the potential applications for the integrated circuit 22. For instance, the integrated circuit 22 may be used in hand-held instruments that have a limited power source.

Figure 2A:
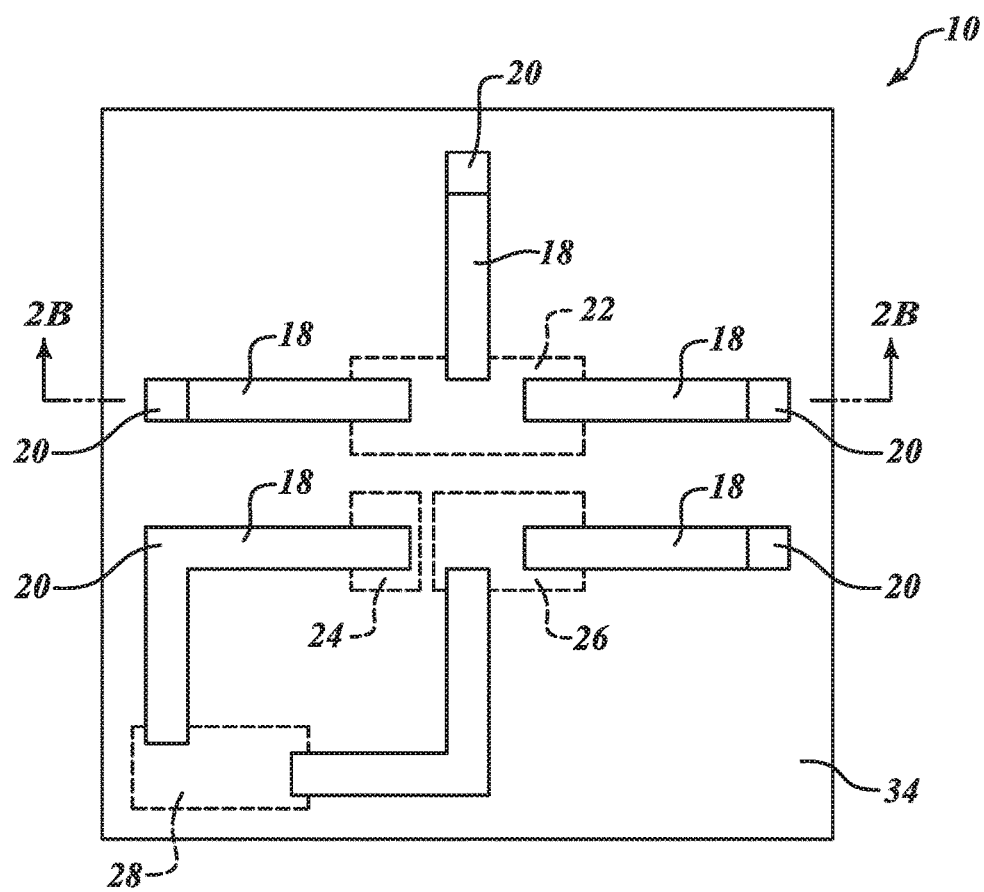
FIG. 2A to FIG. 3B are plan views and cross-sectional views illustrating steps of a method for fabricating a temperature regulated circuit according to at least one embodiment disclosed herein.

FIGS. 2A to 3B are plan views and cross-sectional views illustrating steps of a method for fabricating the temperature regulated circuit 10 according to principles disclosed herein. FIG. 2A is a plan view of the temperature regulated circuit 10 at a first step, and FIG. 2B is a cross-sectional view of the temperature regulated circuit 10 along the axis shown in FIG. 2A. FIG. 3A is a plan view of the temperature regulated circuit 10 at a subsequent step, and FIG. 3B is a cross-sectional view of the temperature regulated circuit 10 along the axis shown in FIG. 3A.

Figure 2B:
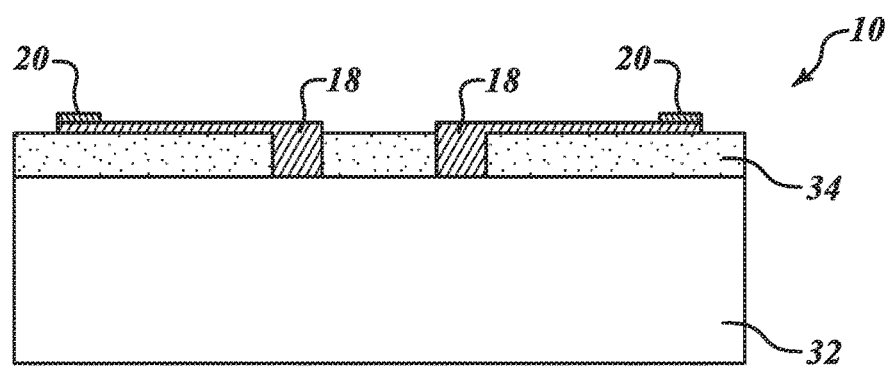

At the step illustrated in FIGS. 2A and 2B, the temperature regulated circuit 10 includes a substrate 32, such as a single crystalline silicon wafer, and an insulating layer 34. The insulating layer 34 is formed on the substrate 32. In a preferred embodiment, the insulating layer 34 is made of a thermally insulating material, such as silicon dioxide.

The integrated circuit 22, the temperature sensor 24, the heater 26, and the controller 28 are fabricated in the substrate 32. In particular, the integrated circuit 22, the temperature sensor 24, and the heater 26 are fabricated in a central portion of the substrate 32, and the controller 28 is fabricated in a peripheral portion of the substrate 32 that surrounds the central portion. In a preferred embodiment, as previously discussed, the temperature sensor 24 and the heater 26 are positioned in close proximity to the integrated circuit 22. The integrated circuit 22, the temperature sensor 24, the heater 26, and the controller 28 may be fabricated in the substrate 32 using techniques known or later developed. For example, the integrated circuit 22 may be fabricated using a dielectrically isolated process. The components of the integrated circuit 22, the temperature sensor 24, the heater 26, and the controller 28 are not shown in FIG. 2B for simplicity reasons.

The conductive tracks 18 are formed on the insulating layer 34. As previously discussed, the conductive tracks 18 provide electrical connections between circuitry positioned in the central portion of the substrate 32 and bond pads and circuitry positioned in the peripheral portion of the substrate 32. For example, the conductive tracks 18 may couple the integrated circuit 22 and the temperature sensor 24 to bond pads 20, and couple the heater 26 to the controller 28. As shown in FIG. 2B, the conductive tracks are formed through the insulating layer 34 to connect to the integrated circuit 22.

The bond pads 20 are formed on respective conductive tracks 18. In particular, the bond pads 20 are formed on portions of the conductive tracks 18 that are located on the peripheral portion of the substrate 32.

Figure 3A:
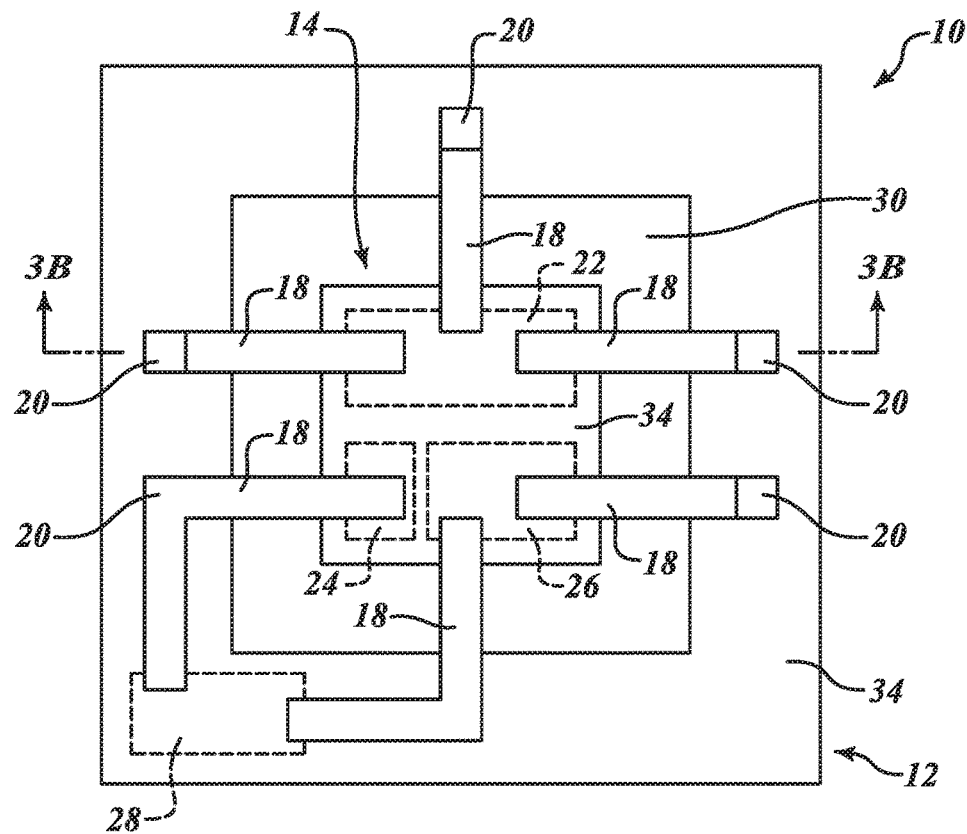
Figure 3B:
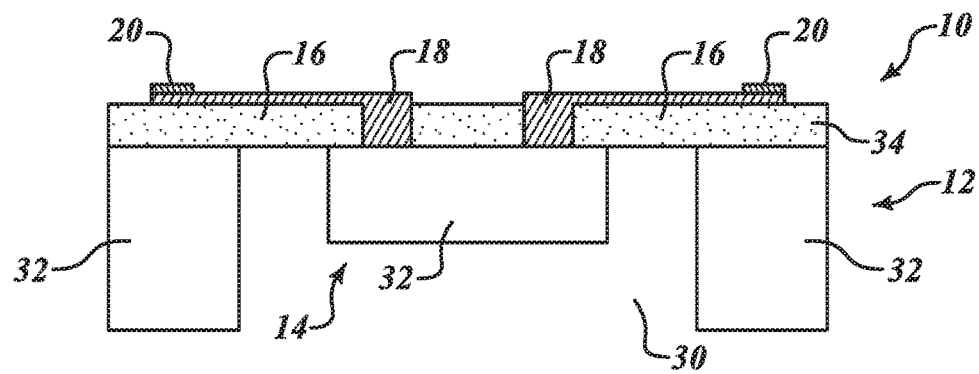

At a subsequent step, illustrated in FIGS. 3A and 3B, portions of the substrate 32 and the insulating layer 34 are removed to form the opening 30 and create the frame 12 and the suspended mass 14.

As previously discussed, portions of the substrate 32 are removed such that the suspended mass 14 has a thickness that is smaller than the thickness of the frame 12 to prevent the suspended mass 14 from contacting a surface below the suspended mass 14.

Portions of the insulating layer 32 are removed to create the support beams 16. As previously discussed, the support beams 16 suspend the suspended mass 14 from the frame 12. Portions of the substrate 32 and the insulating layer 34 may be removed by using techniques known or later developed. For example, deep reactive-ion etching (DRIE) may be used to etch the substrate 32 and the insulating 34.

In another embodiment, the temperature regulated circuit 10 is fabricated using a buried oxide (BOX) wafer, instead of the substrate 32 and the insulating layer 34. Namely, similar to the step described with respect to FIGS. 2A and 2B, the integrated circuit 22, the temperature sensor 24, and the heater 26 is fabricated in a central portion of the BOX wafer, and the controller 28 is fabricated in a peripheral portion of the BOX wafer. Subsequently, similar to the step described with respect to FIGS. 3A and 3B, the BOX wafer is micro machined to form the frame 12 and the suspended mass 14. For example, the BOX wafer may be etched from the top and bottom using a combination of wet etching or DRIE, or a combination of both.

Figure 4:
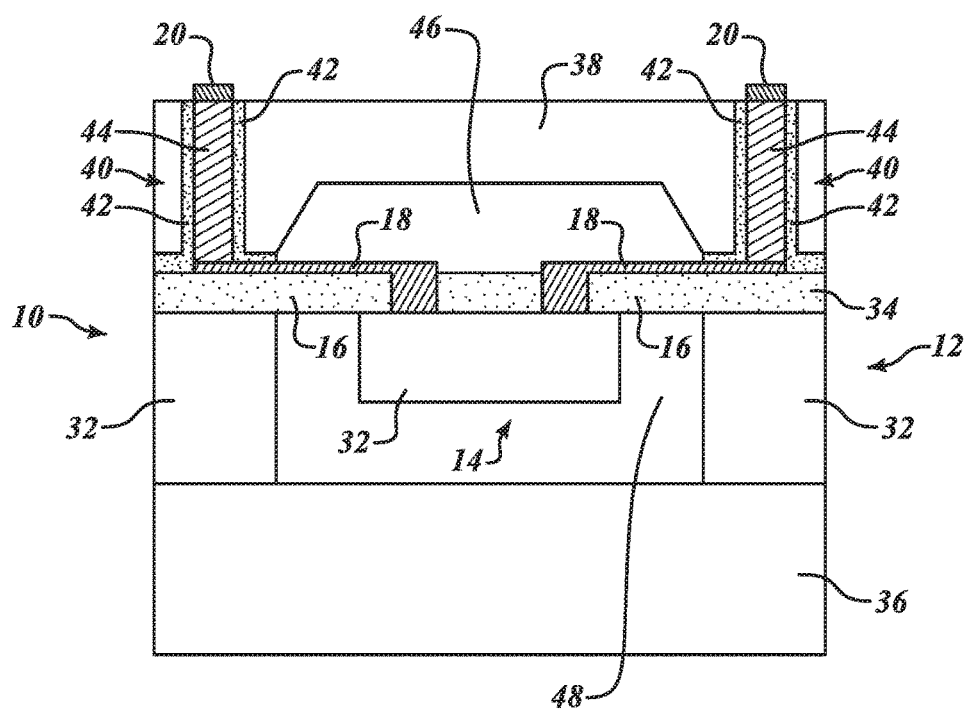
FIG. 4 is a cross-sectional view of a temperature regulated circuit that includes wafer-level packaging according to at least one embodiment disclosed herein.

FIG. 4 is a cross-sectional view of the temperature regulated circuit 10 including wafer-level packaging according to principles disclosed herein. The wafer-level packaging includes a first wafer 36 and a second wafer 38.

The temperature regulated circuit 10 is positioned on the first wafer 36. In particular, the frame 12 is positioned on an upper surface of the first wafer 36. The upper surface of the first wafer 36 is spaced from the lower surface of the suspended mass 14 to minimize heat dissipation from the integrated circuit 22 to the first wafer 36.

The second wafer 38 is positioned on the temperature regulated circuit 10. The second wafer 38 includes a cavity 46. The cavity 46 spaces the lower surface of the second wafer 38 from the upper surface of the suspended mass 14 to minimize heat dissipation from the integrated circuit 22 to the second wafer 38.

The second wafer 38 also includes micro-vias 40. Each of the micro-vias 40 includes conductive material 44 and a dielectric layer 42 that lines the trench walls of the micro-via. Each of the micro-vias 40 is coupled to a respective conductive track 18. The micro-vias 40 and the conductive tracks 18 together provide electrical connections between circuitry on the suspended mass 14 and circuitry or bond pads 20 on the upper surface of the second wafer 38.

The first wafer 36, the second wafer 38, and the frame 12 form a chamber 48 for the integrated circuit 22. The chamber 48 ensures that the integrated circuit 22 does not contact any neighboring surfaces and dissipate heat. In a preferred embodiment, the chamber is evacuated or filled with a gas, such as nitrogen, to further improve thermal insulation of the integrated circuit 22. In addition, the utilization of wafer-level packaging may reduce packing cost and size of the temperature regulated circuit 10.

Although not shown in FIG. 4, the first wafer 36 and the second wafer 38 may include additional integrated circuits. In one embodiment, the controller 28 is formed in the second wafer 38, instead of the frame 12, and connected to at least one of the micro-vias 40 for electrical coupling the temperature sensor 24 and the heater 26 on the suspended mass 14

The wafer-level packaging results in increased thermal resistance of the integrated circuit 22 and further reduces the power needed to regulate the temperature of the integrated circuit 22.

Figure 5:
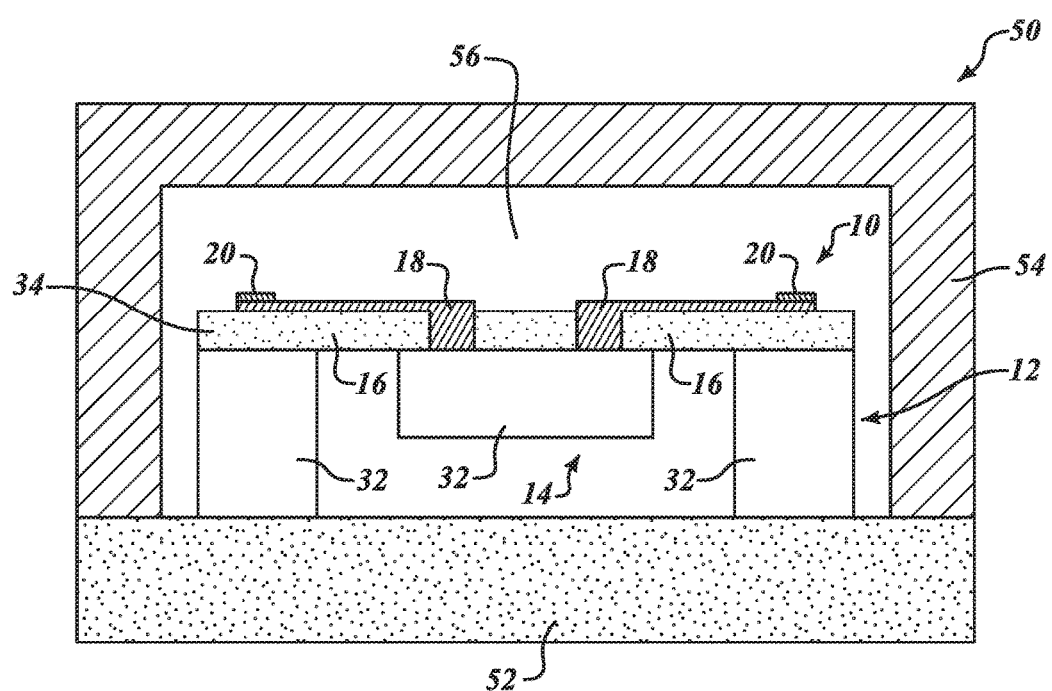
FIG. 5 is a cross-sectional view of a temperature regulated circuit in a hermetic vacuum package according to at least one embodiment disclosed herein.

FIG. 5 is a cross-sectional view of the temperature regulated circuit 10 in a hermetic vacuum package 50 according to principles disclosed herein. The hermetic vacuum package 50 includes a base 52 and a lid 54.

The temperature regulated circuit 10 is positioned on the base 52. In a preferred embodiment, the base 52 is ceramic substrate. The lid 54 is coupled to the base 52 and encapsulates the temperature regulated circuit 10.

The base 52 and the lid 54 form a chamber 56. Similar to the chamber 48, the chamber 56 ensures that the integrated circuit 22 does not contact any neighboring surfaces and dissipate heat. In a preferred embodiment, the chamber is evacuated or filled with a gas, such as nitrogen, to improve thermal insulation of the integrated circuit 22.

Although not shown in FIG. 5, the hermetic vacuum package 50 may also include wire bonds that are connected to the bond pads 20 to a location outside of the hermetic vacuum package 50.

The hermetic vacuum package results in increased thermal resistance of the integrated circuit 22 and further reduces the power needed to regulate the temperature of the integrated circuit 22.

The temperature regulated circuit 10 disclosed herein results in a low power solution for temperature regulation of the integrated circuit 22. Reducing the power needed to regulate the temperature of the integrated circuit 22 increases the potential applications for precision integrated circuits. For instance, the integrated circuit 22 may be used in hand-held instruments that have a limited power source.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a frame having an opening;
a controller on the frame;
a plurality of support beams made of thermally insulating material;
a suspended mass positioned in the opening of the frame, the suspended mass being coupled to the frame by the plurality of support beams;
an integrated circuit, a temperature sensor, and a heater on the suspended mass;
a first conductive track on a first support beam of the plurality of support beams, the first conductive track electrically coupled to the integrated circuit, the temperature sensor, or the heater.

2. The device of claim 1, further comprising a second conductive track on a second support beam of the plurality of support beams, the second conductive track electrically coupled to the controller and to the temperature sensor or the heater.

3. The device of claim 1, wherein the controller is configured to receive temperature measurements from the temperature sensor and control the heater based on the temperature measurements.

4. The device of claim 1, further comprising:
a first wafer, the frame positioned on the first wafer; and
a second wafer overlying the frame and the suspended mass, the suspended mass being spaced from the first and second wafers.

5. The device of claim 4, wherein the frame, the first wafer, and the second wafer form a chamber around the suspended mass.

6. The device of claim 5, wherein the chamber is evacuated.

7. The device of claim 4, further comprising a conductive via formed through the second wafer, the conductive via being electrically coupled to the first conductive track.

8. The device of claim 1, further comprising:
a ceramic base, the frame being positioned on the ceramic base; and
a lid coupled to the ceramic base, the lid and the ceramic base forming a chamber around the suspended mass.

9. The device of claim 1, further comprising a bond pad on the frame, the first conductive track being electrically coupled to the bond pad.

10. A device, comprising:
a substrate including:
a first portion having an opening; and
a second portion positioned in the opening and spaced from the first portion;
a controller on the first portion of the substrate;
an integrated circuit, a temperature sensor, and a heater on the second portion of the substrate;
an insulating layer on the first and second portions of the substrate, the insulating layer coupling the first and second portions of the substrate to each other; and
a first conductive track on the insulating layer, the first conductive track being electrically coupled to the integrated circuit, the temperature sensor, or the heater.

11. The device of claim 10, further comprising a second conductive track on the insulating layer, the second conductive track electrically coupled to the controller and to the temperature sensor or the heater.

12. The device of claim 10, wherein the controller is configured to receive temperature measurements from the temperature sensor and control the heater based on the temperature measurements.

13. The device of claim 10, further comprising first and second wafers, the substrate being positioned between the first and second wafers.

14. The device of claim 10, further comprising a hermetic vacuum package, the substrate being positioned inside of the hermetic vacuum package.

15. The device of claim 10, further comprising a bond pad on the first portion of the substrate, the bond pad electrically coupled to the first conductive track.

16. A method, comprising:
fabricating a controller on a peripheral component of a semiconductor die;
fabricating an integrated circuit, a temperature sensor, and a heater element on a central component of the semiconductor die, the peripheral component surrounding the central component; and
suspending the central component from the peripheral component by removing portions of the semiconductor die that is between the peripheral component and the central component.

17. The method of claim 16, further comprising forming a conductive track on the semiconductor die, the conductive track electrically coupling a bond pad on the peripheral component of the semiconductor die to the integrated circuit, the temperature sensor, or the heater element.

18. The method of claim 16, further comprising:
positioning the semiconductor die on a first wafer; and
positioning a second wafer on the semiconductor die, the first and second wafers being spaced from the central component of the semiconductor die, the peripheral component of the semiconductor die, the first wafer, and the second wafer forming a chamber.

19. The method of claim 18, further comprising evacuating the chamber.

20. The method of claim 16, further comprising positioning the semiconductor die in a hermetic vacuum package.

* * * * *